(12) United States Patent
Hongo et al.

(10) Patent No.: US 6,908,534 B2
(45) Date of Patent: Jun. 21, 2005

(54) SUBSTRATE PLATING METHOD AND APPARATUS

(75) Inventors: Akihisa Hongo, Tokyo (JP); Mizuki Nagai, Tokyo (JP); Kanji Ohno, Kanagawa (JP); Ryoichi Kimizuka, Tokyo (JP); Megumi Maruyama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 63 days.

(21) Appl. No.: 10/017,384

(22) Filed: Dec. 18, 2001

(65) Prior Publication Data

US 2002/0064591 A1 May 30, 2002

Related U.S. Application Data

(62) Division of application No. 09/674,179, filed as application No. PCT/JP99/02271 on Apr. 28, 1999, now Pat. No. 6,517,894.

(30) Foreign Application Priority Data

Apr. 30, 1998 (JP) ........................................... 10-136151
Apr. 30, 1998 (JP) ........................................... 10-136152

(51) Int. Cl.$^7$ ........................... C25D 17/00; B05C 3/00; B05C 19/02
(52) U.S. Cl. ...................... 204/269; 118/423; 118/429
(58) Field of Search ........................ 204/269, 206–210; 118/423, 429

(56) References Cited

U.S. PATENT DOCUMENTS

| | | | | |
|---|---|---|---|---|
| 3,616,426 A | * | 10/1971 | Nakao ........................ 204/207 |
| 3,716,462 A | | 2/1973 | Jensen | |
| 3,844,909 A | * | 10/1974 | McCary et al. ............. 205/138 |
| 3,865,700 A | * | 2/1975 | Fromson ................. 204/211 X |
| 3,930,963 A | | 1/1976 | Polichette et al. | |
| 3,963,569 A | * | 6/1976 | Toledo ........................ 204/206 |
| 4,039,398 A | * | 8/1977 | Furuya ................... 204/206 X |
| 4,959,278 A | | 9/1990 | Shimauchi et al. | |
| 5,116,430 A | | 5/1992 | Hirai et al. | |
| 5,151,168 A | | 9/1992 | Gilton et al. | |

(Continued)

FOREIGN PATENT DOCUMENTS

| | | |
|---|---|---|
| GB | 2285174 | 6/1995 |
| JP | 53-53527 | 5/1978 |
| JP | 53-143971 | 12/1978 |
| JP | 62-276893 | 12/1987 |
| JP | 5-140795 | 6/1993 |
| JP | 7-41991 | 2/1995 |
| WO | 8705182 | 8/1987 |

OTHER PUBLICATIONS

Translation of JP 5–140795 (Jun. 1993).
Translation of JP 62–276893 (Dec. 1987).
Translation of JP 53–53527 (May 1978).
Translation of JP 53–143971 (Dec. 1978).
Translation of JP 07–41991 (Feb. 1995).

Primary Examiner—Donald R. Valentine
(74) Attorney, Agent, or Firm—Wenderoth, Lind & Ponack, L.L.P.

(57) ABSTRACT

A method and apparatus for plating a substrate is provided, wherein fine pits formed in the substrate, such as fine channels for wiring, are filled with a copper, copper alloy, or other material with low electrical resistance. The method is performed on a wafer W having fine pits (10) to fill the fine pits with a metal (13) and includes performing a first plating process (11) by immersing the wafer in a first plating solution having a composition superior in throwing power; and performing a second plating process (12) by immersing the substrate in a second plating solution having a composition superior in leveling ability.

12 Claims, 5 Drawing Sheets

U.S. PATENT DOCUMENTS

| | | |
|---|---|---|
| 5,209,817 A | 5/1993 | Ahmad et al. |
| 5,549,808 A | 8/1996 | Farooq et al. |
| 5,639,316 A | 6/1997 | Gabral, Jr. et al. |
| 5,913,147 A | 6/1999 | Dubin et al. |
| 6,074,544 A | 6/2000 | Reid et al. |
| 6,197,181 B1 | 3/2001 | Chen |
| 6,277,263 B1 | 8/2001 | Chen |
| 6,290,833 B1 | 9/2001 | Chen |
| 6,294,059 B1 | 9/2001 | Hongo et al. |
| 2002/0004301 A1 | 1/2002 | Chen et al. |

\* cited by examiner

SUBSTRATE PLATING METHOD AND APPARATUS

This is a Divisional Application of U.S. patent application Ser. No. 09/674,179, filed Oct. 27, 2000 which is the national stage of PCT/JP99/02271, filed Apr. 28, 1999, and now U.S. Pat. No. 6,517,894.

TECHNICAL FIELD

The present invention relates to a substrate plating method and apparatus, and particularly to a substrate plating apparatus for filling pits for fine wires and the like formed in a semiconductor wafer with copper or another metal.

BACKGROUND ART

Conventionally, wire channels have been formed in a semiconductor wafer by first depositing a conducting layer on the wafer surface using sputtering or a similar technique. Next, the unnecessary portions of the conducting layer are removed through a chemical dry etching process with a pattern mask formed of resist or the like.

In conventional processes, aluminum (Al) or an aluminum alloy has been used to form the wire circuit. However, wiring has been made thinner to keep up with the increased complexity of semiconductor devices. The increasing current density generates increased thermal stress and higher temperatures. This causes stress-migration or electro-migration, which grow more remarkable as the layers of aluminum or the like are manufactured thinner and give rise to such disorders as wire breakage or short-circuiting.

To avoid an excessive generation of heat in the wiring, a metal having a higher conductivity such as copper is required to form the wiring. However, it is difficult to perform dry etching on copper or a copper alloy that has been deposited over the entire surface as in the process described above. An alternative process would be to first form channels for the wiring according to a predetermined pattern and then fill the channels with copper or a copper alloy. This method eliminates the process of removing unnecessary parts of the conductive layer by etching, requiring only that the surface of the wafer be polished to remove uneven areas. The method has the additional benefit of being able to form simultaneously multiple areas called plugs that connect the tops and bottoms of channels.

However, the shape of these wiring channels and plugs have a considerably high aspect ratio (the ratio of depth to width) as the width of the wiring gets smaller, making it difficult to fill the channels with an even layer of metal using sputtering deposition. The chemical vapor deposition method (CVD) has been used for depositing various materials, but it is difficult to prepare an appropriate gas material for copper or a copper alloy. Further, when using an organic material, carbon from the material becomes mixed in with the deposition layer and increases the resistance.

Therefore, a method was proposed for performing electroless or electrolytic plating by immersing a substrate into a plating solution. With this method, it is possible to fill wire channels having a high aspect ratio with a uniform layer of metal.

When performing an electrolytic plating process, for example, generally a plating solution having a composition including copper sulfate and sulfuric acid is used. If the solution has a low concentration of copper sulfate and a high concentration of sulfuric acid, it is known that the plating solution will have high conductivity and great polarization, thereby improving throwing power and coating uniformity. In contrast, if the plating solution has a high concentration of copper sulfate and a low concentration of sulfuric acid, it is known that through the work of an additive the solution will have good leveling ability, in other words, plating will grow from the bottom of the fine pits formed in the substrate surface.

For this reason, performing a plating process using a plating solution having a composition superior in throwing power and coating uniformity to fill copper in the fine pits of a substrate having a large aspect ratio, the leveling ability of the solution is poor. The inlets of the fine pits will be blocked first before the pits are filled, thereby tending to form voids in the pits. On the other hand, using a plating solution with a composition superior in leveling ability will be inferior in throwing power and coating uniformity, resulting in unplated areas on the walls and bottoms of the fine pits.

Generally in these plating processes, a copper seed layer is formed on the bottom surface and area surrounding the fine pits of the substrate. However, when performing electrolytic plating directly on a barrier layer, such as TiN or TaN, the sheet resistance of the barrier layer is much larger than the resistance of the copper sulfate plating solution. As a result, needle-shaped crystals are formed in plating processes using copper sulfate solution, resulting in a plating layer having loose adherence.

In addition a copper pyrophosphate plating solution is also widely used because of its close adhesion due to high polarization and layered deposition property. However, copper pyrophosphate plating solution has poor leveling ability. Hence, when filling fine pits with copper in a plating process using copper pyrophosphate plating solution, the inlets to the fine pits become blocked first, thereby developing voids, as described above. Of course, it is also possible to use copper pyrophosphate plating solution as a first layer over a copper seed layer.

DISCLOSURE OF INVENTION

In view of the foregoing, it is an object of the present invention to provide a method and apparatus of plating a substrate capable of filling fine pits of channels and the like for fine wiring with copper, a copper alloy, or similar material having a low electrical resistance, such that the plating is uniform with no gaps and has a smooth surface.

These objects and others will be attained by a method for plating a substrate having a surface with fine pits formed therein, the method comprising performing a first plating process by immersing the substrate in a first plating solution having a composition superior in throwing power and performing a second plating process by immersing the substrate in a second plating solution having a composition superior in leveling ability.

With this method, a uniform initial plating layer without unplated areas on the side walls and bottom of the fine pits is formed in the first plating process. A surface plating layer having a smooth surface and no void is formed on top of the initial plating layer in the second plating process.

According to another aspect of the present invention, the first plating solution is a high throwing power copper sulfate plating solution for printed circuit boards and the second plating solution is a copper sulfate solution. The high throwing power copper sulfate plating solution has a low concentration of copper sulfate, a high concentration of sulfuric acid, and is therefore superior in throwing power and coating uniformity. The copper sulfate plating solution has a high concentration of copper sulfate and a low concentration of sulfuric acid and is superior in leveling ability. As a result, plating metal is uniformly deposited on the surface of the semiconductor wafer, eliminating unplated areas formed on the side and bottom surfaces of the fine pits.

According to another aspect of the present invention, the high throwing power copper sulfate plating solution has a composition of 5–100 g/l of copper sulfate and 100–250 g/l of sulfuric acid, and the copper sulfate solution has a composition of 100–300 g/l of copper sulfate and 10–100 g/l of sulfuric acid.

According to another aspect of the present invention, a method for plating a substrate having a surface with fine pits formed therein and coated with a barrier layer, comprises performing a first plating process by immersing the substrate in a first plating solution having a composition superior in throwing power and in closely adhering to the barrier layer, and performing a second plating process by immersing the substrate in a second plating solution having a composition superior in leveling ability.

With this method, a uniform initial plating layer without unplated areas on the side walls and bottom of the fine pits covered by the barrier layer is formed in the first plating process. A surface plating layer having a smooth surface and no void is formed on top of the initial plating layer in the second plating process.

According to another aspect of the present invention, the first plating solution is a copper pyrophosphate solution for printed circuit boards and the second plating solution is a copper sulfate solution. Due to the high polarization and the layered deposition property, the copper pyrophosphate sulfate solution forms a coating in close adherence with the barrier layer 5 formed of TiN or the like. The copper sulfate plating solution having a high concentration of copper sulfate and a low concentration of sulfuric acid is superior in leveling ability. Hence, this process forms a plating layer free of voids in the fine pits covered by the barrier layer, and the surface of the plating layer is smooth.

According to another aspect of the present invention, the copper sulfate solution has a composition of 100–300 g/l of copper sulfate and 10–100 g/l of sulfuric acid.

According to another aspect of the present invention, a substrate plating apparatus comprises a plating bath, first plating solution supplying means for supplying a first plating solution having a composition superior in throwing power to the plating bath, second plating solution supplying means for supplying a second plating solution having a composition superior in leveling ability to the plating bath, and switching means for switching on and off the plating solutions supplied from the first and second plating solution supplying means.

With this construction, both the first and second plating processes can be performed in the same apparatus, since supply of plating solution is switched between processes, from the first plating solution superior in throwing power to the second plating solution superior in leveling.

According to another aspect of the present invention, the first plating solution has a composition with qualities superior for close adherence to a barrier layer formed on the surface of the substrate. With this construction, both the first and second plating processes can be performed in the same apparatus, since supply of plating solution is switched between processes, from the first plating solution superior in adherence to the barrier layer to the second plating solution superior in leveling.

BEST MODE FOR CARRYING OUT THE INVENTION

A substrate plating method and apparatus according to preferred embodiments of the present invention will be described while referring to the accompanying drawings.

A substrate plating method according to a first embodiment forms a copper plating on the surface of a semiconductor wafer in order to obtain a semiconductor device having wiring formed from the copper layer. This process is described with reference to FIGS. 1A–1C.

Figure 1A:
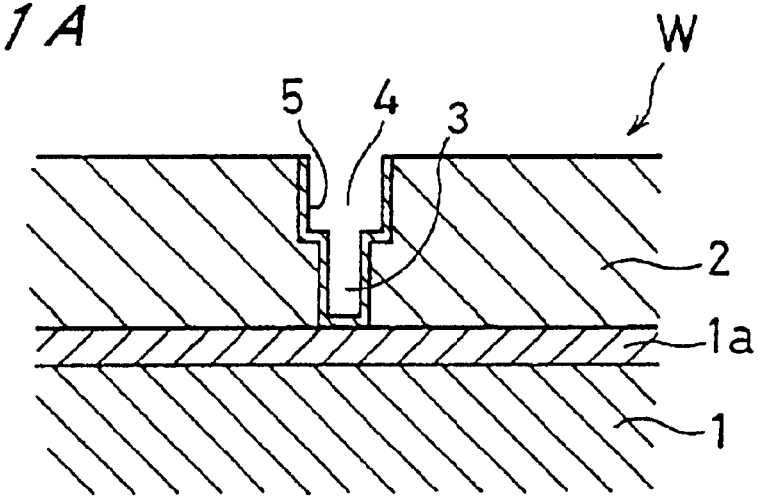
FIGS. 1A–1C are cross-sectional diagrams showing the process for manufacturing a semiconductor element according to the substrate plating method of the present invention.
Figure 1B:
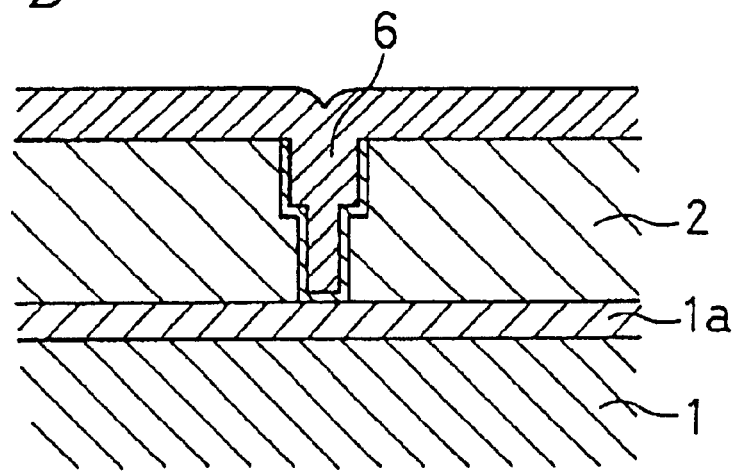

As shown in FIG. 1A, a semiconductor wafer W is formed of a semiconductor material 1, a conducting layer 1$a$ formed on the top surface of the semiconductor material 1, and an $SiO_2$ insulating layer 2 deposited on top of the conducting layer 1$a$. A contact hole 3 and a channel 4 are formed in the insulating layer 2 by a lithography etching technique. A barrier layer 5, such as TiN, is formed over the surfaces in the contact hole 3 and channel 4.

Figure 1C:
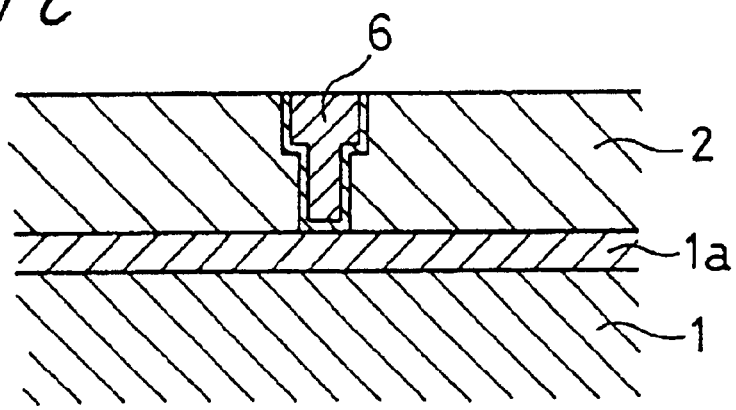

By performing a copper plating process on the surface of the semiconductor wafer W, the contact hole 3 and channel 4 are filled with a copper layer 6. The copper layer 6 is also deposited on top of the insulating layer 2. Next, chemical mechanical polishing (CMP) is performed to remove the copper layer 6 from the top of the insulating layer 2. This process is necessary to form the surface on the copper layer 6 filling the contact hole 3 and channel 4 to be approximately flush with the surface of the insulating layer 2. As a result, the copper layer 6 forms wiring, as shown in FIG. 1C.

Figure 2:
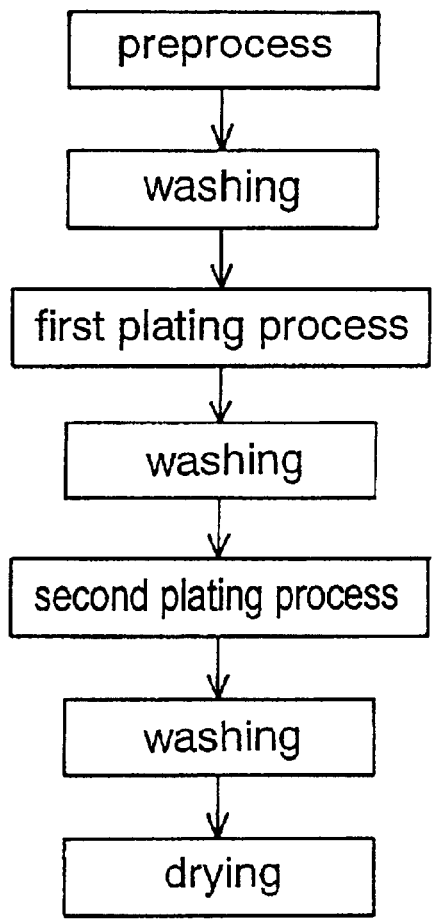
FIG. 2 is a flowchart showing the process of the plating method of the preferred embodiment.

Next, an electrolytic plating process for plating the semiconductor wafer W shown in FIG. 1A will be described with reference to FIG. 2. First, a preprocess is performed. In the preprocess, the semiconductor wafer W is immersed in an aqueous sulfuric acid solution to activate the semiconductor wafer W.

Figure 3A:
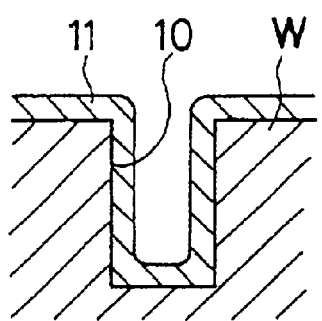
FIGS. 3A–3C are cross-sectional diagrams illustrating the process of FIG. 2.

After washing the semiconductor wafer W, a first plating process is performed by immersing the semiconductor wafer W into a first plating solution, such as a high throwing power copper sulfate plating solution used for printed circuit boards. As shown in FIG. 3A, this process forms a uniform initial plating layer 11 over the surface of a fine pit 10 formed in the semiconductor wafer W, wherein the surface includes the bottom and side walls of the fine pit 10. Here, the high throwing power copper sulfate solution has a low concentration of copper sulfate, a high concentration of sulfuric acid, and is superior in throwing power and coating uniformity. An example composition of this solution is 5–100 g/l of copper sulfate and 100–250 g/l of sulfuric acid.

Since the plating solution has a low concentration of copper sulfate and a high concentration of sulfuric acid, the conductivity of the solution is high and the polarization is great, thereby improving throwing power. As a result, plating metal is uniformly deposited on the surface of the semiconductor wafer W, eliminating unplated areas formed on the side and bottom surfaces of the fine pit 10.

Figure 3B:
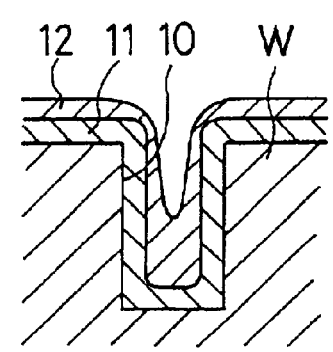
Figure 3C:
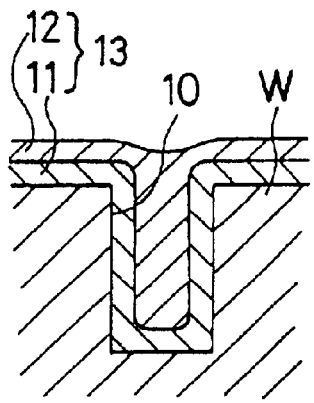

After again washing the semiconductor wafer W, a second plating process is performed by immersing the semiconductor wafer W into a second plating solution, such as a copper sulfate plating solution for decorative uses. As shown in FIGS. 3B and 3C, this process forms a plating layer 12 having a flat surface on the surface of the initial plating layer 11. Here, the copper sulfate plating solution has a high concentration of copper sulfate and a low concentration of sulfuric acid and is superior in leveling ability. An example composition of the solution is 100–300 g/l of copper sulfate and 10–100 g/l of sulfuric acid.

Figure 4A:
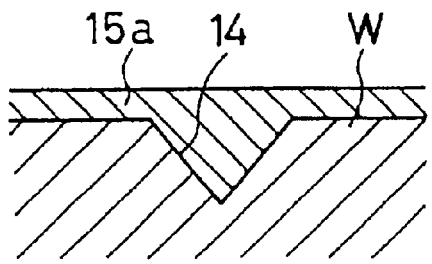
FIGS. 4A–4B are cross-sectional diagrams illustrating leveling ability.
Figure 4B:
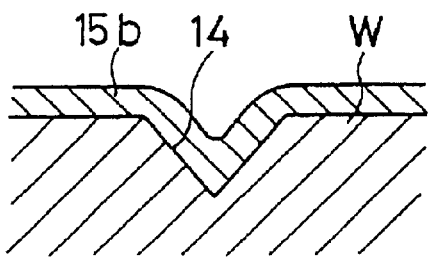

Here, leveling ability defines a quality describing the degree of smoothness on the plating surface. With good leveling ability, it is possible to obtain a plating layer 15a having a flat surface, as shown in FIG. 4A, even when a depression 14 is formed in the surface of the semiconductor wafer W. With a poor leveling ability, however, a plating layer 15b, as shown in FIG. 4B, is obtained. Here, the shape of the depression 14 formed in the surface of the semiconductor wafer W is reflected in the plating layer 15b.

Hence, when using a plating solution having superior leveling ability, film at the in let to the fine pit 10 grows slow, as shown in FIG. 3B. This slow growth can prevent the generation of voids, thereby filling the fine pit 10 with a uniform layer of copper plating having no gaps. Moreover, it is possible to achieve a smooth surface on the plating.

Subsequently, the semiconductor wafer W is washed and dried to complete the plating process. This process achieves a plating layer 13 having a flat surface and free of voids. The fine pit 10 contains no unplated areas on its bottom or side walls.

Figure 5:
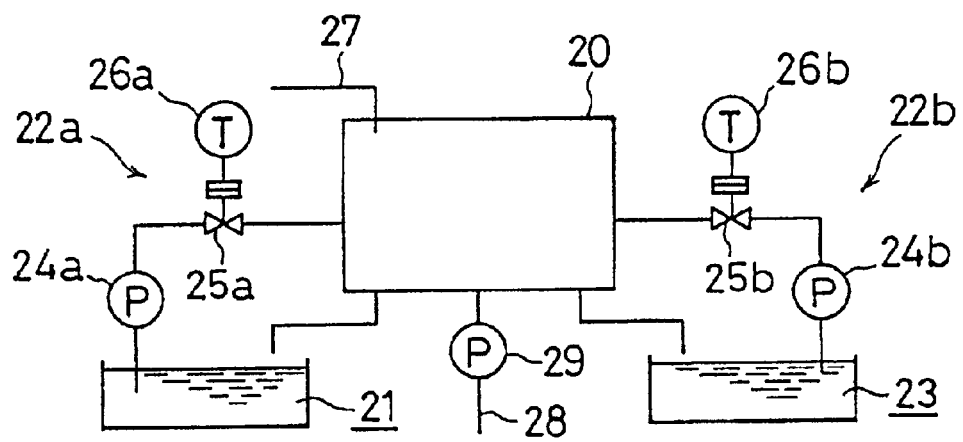
FIG. 5 shows the general construction of a plating apparatus according to the preferred embodiment.

FIG. 5 shows the construction of a plating apparatus suitable for the plating process described above.

The plating apparatus is provided with a plating bath 20. A first plating solution supplying section 22a supplies a first plating solution 21 into the plating bath 20 and a second plating solution supplying section 22b supplies a second plating solution 23 into the plating bath 20.

The first plating solution supplying section 22a includes a pump 24a for pumping first plating solution 21 into the plating bath 20. A shut-off valve 25a is disposed upstream from the pump 24a, and a timer 26a opens and closes the shut-off valve 25a.

Similarly, the second plating solution supplying section 22b includes a pump 24b for pumping second plating solution 23 into the plating bath 20. A shut-off valve 25b is disposed upstream from the pump 24b, and a timer 26b opens and closes the shut-off valve 25b.

In addition, a wash water supply tube 27 and a discharge tube 28 are connected to the plating bath 20 for introducing wash water into the plating bath 20 and discharging wash water out of the plating bath 20, respectively. A pump 29 is connected to the tube 28.

As described above, a semiconductor wafer W, having undergone a preprocess, is inserted into the plating bath 20. Wash water is introduced into the plating bath 20 and the semiconductor wafer W is washed. Next, the shut-off valve 25a is opened according to the timer 26a. The first plating solution 21 is supplied into the plating bath 20, and the first plating process is performed. After a fixed time has elapsed, the shut-off valve 25a is closed. Wash water is again introduced into the plating bath 20 for washing the semiconductor wafer W. Subsequently, the shut-off valve 25b of the second plating solution supplying section 22b is opened according to timer 26b. The second plating solution 23 is supplied into the plating bath 20 and the second plating process is performed. Accordingly, it is possible to perform both the first and second plating processes consecutively using the same apparatus.

In the example described above, a timer is used for switching the supply of plating solution on and off. However, it is obvious that any means capable of performing this process can be used.

Figure 9:
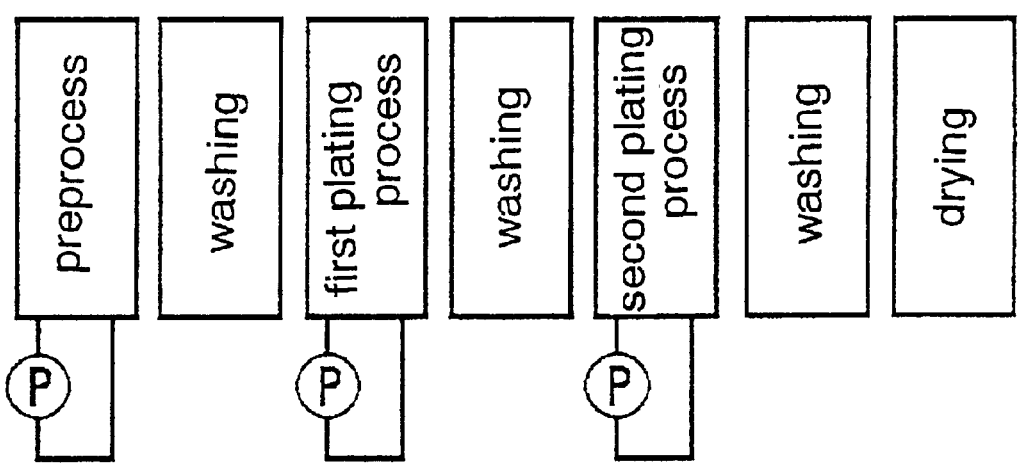
FIG. 9 is a flowchart showing the plating process employing a variation of the plating apparatus shown in FIG. 5.

In the example described above, the same processing tank is used for performing the first plating process, the second plating process, and the washing processes. However, these processes can be performed using separate baths for each process. As shown in FIG. 9, for example, multiple baths can be provided, wherein the plating process is performed by immersing the semiconductor wafer W into each bath in order according to each step of the process.

First Embodiment

In the first embodiment, the fine pit 10 having a width of 1.0 μm or less is formed on the semiconductor wafer W. An aqueous solution having 100 g/l of sulfuric acid is maintained at a temperature of 50° C. A preprocess is performed by immersing the semiconductor wafer W into the aqueous solution for 15 seconds. Subsequently, the first plating process is performed with the first plating solution and, after washing the semiconductor wafer W, the second plating process is performed using the second plating solution. The semiconductor wafer W is then washed and dried.

Here, the composition of the first plating solution is as follows.

| | |
|---|---|
| $CuSO_4 \cdot 5H_2O$ | 70 g/l |
| $H_2SO_4$ | 200 g/l |
| NaCl | 100 mg/l |
| Organic additive | 5 ml/l |

The composition of the second plating solution is as follows.

| | |
|---|---|
| $CuSO_4 \cdot 5H_2O$ | 200 g/l |
| $H_2SO_4$ | 50 g/l |
| NaCl | 100 mg/l |
| Organic additive | 5 ml/l |

The conditions for the plating processes, described below, are the same for both processes.

| | |
|---|---|
| Bath temperature | 25° C. |
| Current density | 2 A/dm$^2$ |
| Plating time | 2.5 min. |
| PH < 1 | |

Figure 6A:
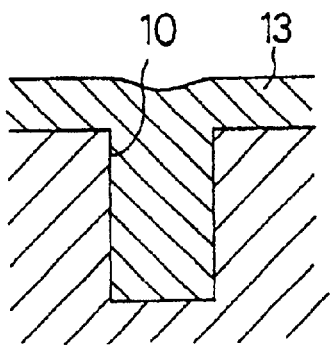
FIGS. 6A–6C are cross-sectional diagrams showing the differences based on first and second comparisons to the first embodiment.

This process forms the plating layer 13 free of voids in the fine pit 10, as shown in FIG. 6A. No unplated areas are developed in the fine pit 10.

First Comparison

Figure 6B:
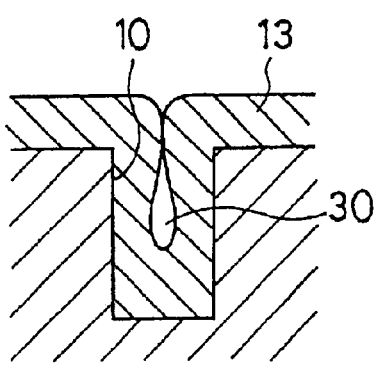

In a first comparison to the first embodiment, a semiconductor wafer W having undergone the same preprocess described above is plated using only the first plating solution. As shown in FIG. 6B, a void 30 is formed in the plating layer 13 within the fine pit 10.

Second Comparison

Figure 6C:
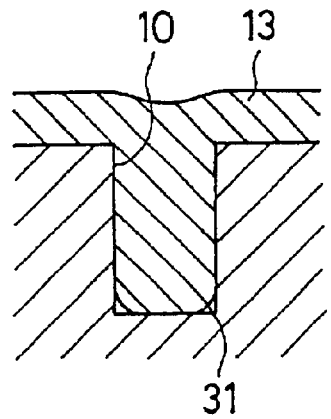

In a second comparison to the first embodiment, a semiconductor wafer W having undergone the same preprocess described above is plated using only the second plating solution. As shown in FIG. 6C, an unplated area 31 exists in a bottom corner of the fine pit 10.

Next, a second embodiment of the present invention will be described.

As shown in FIG. 1A, a semiconductor wafer W is formed of a semiconductor material 1, a conducting layer 1a formed on the top surface of the semiconductor material 1, and an $SiO_2$ insulating layer 2 deposited on top of the conducting layer 1a. A contact hole 3 and a channel 4 are formed in the insulating layer 2 by a lithography etching technique. A barrier layer 5, such as TiN, is formed over the surfaces in the contact hole 3 and channel 4.

Figure 7A:
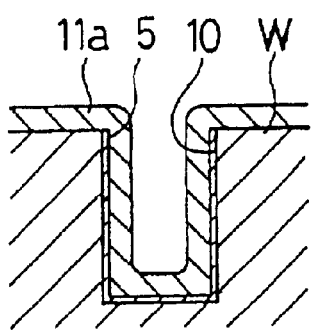
FIGS. 7A–7C are cross-sectional diagrams illustrating the process of the plating method according to the second embodiment.

First, a preprocess is performed. In the preprocess, the semiconductor wafer W is immersed in an aqueous sulfuric acid solution to activate the semiconductor wafer W. After washing the semiconductor wafer W, a first plating process is performed by immersing the semiconductor wafer W into a first plating solution, such as a copper pyrophosphate solution. As shown in FIG. 7A, this process forms a uniform initial plating layer 11 over the surface including the barrier layer 5. The barrier layer 5 covers the bottom and side walls of a fine pit 10 formed in the semiconductor wafer W.

Here, the copper pyrophosphate sulfate solution forms a layered deposition providing superior close adherence with the barrier layer 5. Hence, this process forms an initial plating layer 11a having a throwing power and prevents the generation of unplated areas on the barrier layer 5 covering the fine pit 10.

Figure 7B:
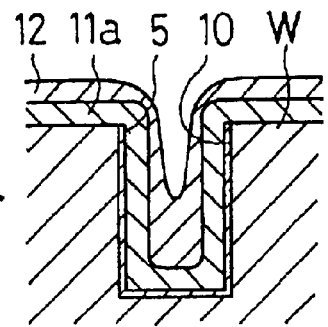
Figure 7C:
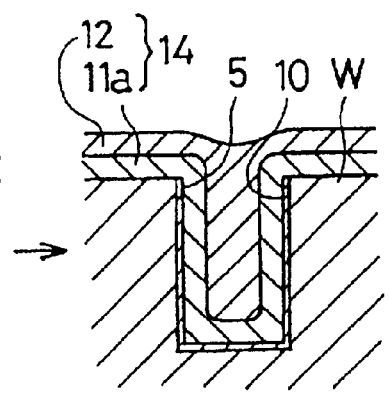

After washing the semiconductor wafer W, a second plating process is performed by immersing the semiconductor wafer W into a second plating solution, such as a copper sulfate plating solution. As shown in FIGS. 7B and 7C, this process forms a plating layer 12 having a flat surface on the surface of the initial plating layer 11a. Here, the copper sulfate plating solution has a high concentration of copper sulfate and a low concentration of sulfuric acid and is superior in leveling ability. An example composition of the solution is 100–300 g/l of copper sulfate and 10–100 g/l of sulfuric acid.

Second Embodiment

In the second embodiment, the fine pit 10 having a width of 1.0 μm or less is formed on the semiconductor wafer W. The barrier layer 5 covers the fine pit 10. An aqueous solution having 100 g/l of sulfuric acid is maintained at a temperature of 50° C. A preprocess is performed by immersing the semiconductor wafer W into the aqueous solution for 15 seconds. Subsequently, the first plating process is performed with the first plating solution and, after washing the semiconductor wafer W, the second plating process is performed using the second plating solution. The semiconductor wafer W is then washed and dried.

Here, the composition of the first plating solution is as follows.

| | |
|---|---|
| $Cu_2P_2O_7.3H_2O$ | 90 g/l |
| $H_4P_2O_7$ | 340 g/l |
| Ammonia | 3 ml/l |
| Organic additive | 0.5 ml/l |

The conditions for the plating process are as follows.

| | |
|---|---|
| Bath temperature | 55° C. |
| Current density | 0.5 A/dm$^2$ |
| Plating time | 3 min. |
| PH 8.5 | |

The composition of the second plating solution is as follows.

| | |
|---|---|
| $CuSO_4.5H_2O$ | 200 g/l |
| $H_2SO_4$ | 50 g/l |
| NaCl | 100 mg/l |
| Organic additive | 5 ml/l |

The conditions for the plating process are as follows.

| | |
|---|---|
| Bath temperature | 25° C. |
| Current density | 2 A/dm$^2$ |
| Plating time | 2.5 min. |
| PH < 1 | |

Figure 8A:
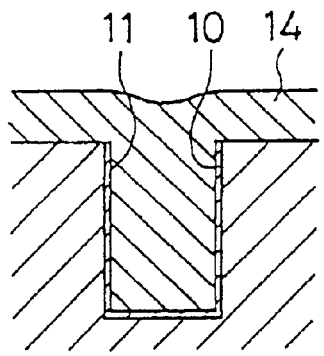
FIGS. 8A–8C are cross-sectional diagrams showing the differences based on first and second comparisons to the second embodiment.

This process forms a plating layer 14 free of voids in the fine pit 10, as shown in FIG. 8A. No unplated areas are developed on the barrier layer 5 within the fine pit 10.

First Comparison

Figure 8B:
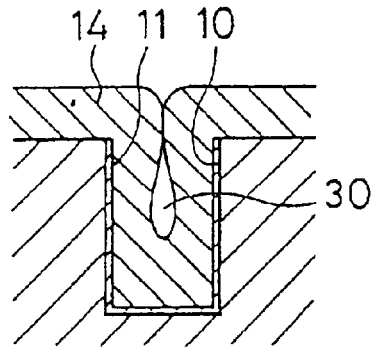

In a first comparison to the first embodiment, a semiconductor wafer W having undergone the same preprocess described above is plated using only the first plating solution. As shown in FIG. 8B, a void 30 is formed in the plating layer 14 within the fine pit 10.

Second Comparison

Figure 8C:
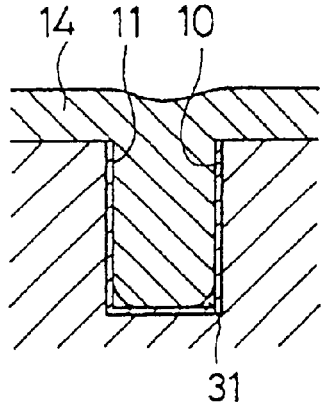

In a second comparison to the first embodiment, a semiconductor wafer W having undergone the same preprocess described above is plated using only the second plating solution. As shown in FIG. 8C, an unplated area 31 exists on the barrier layer 5 in a bottom corner of the fine pit 10.

In the first plating process of the present invention described above, a uniform initial plating layer without unplated areas on the side walls and bottom of the fine pit 10 is formed. In the second plating process of the present invention, a surface plating layer having a smooth surface and no void is formed on top of the initial plating layer. Accordingly, fine pits formed in the substrate, such as fine channels for wiring, can be filled with a copper, copper alloy, or other material having low electrical resistance without gaps in the metal plating and with a level surface.

INDUSTRIAL APPLICABILITY

The present invention is a plating process capable of forming embedded wiring layers and the like in semiconductor wafers and can be applied to the fabrication of LSI chips and other semiconductor devices.

What is claimed is:

1. An apparatus for plating a substrate by immersing the substrate in baths containing plating solutions, the substrate proceeding along a predetermined process path within the apparatus, and the substrate having a surface with fine pits formed thereon, the apparatus comprising:

a first bath containing a first plating solution and being adapted to form a first plating layer within the fine pits;

a second bath disposed after the first bath in the process path and containing a second plating solution different from the first plating solution, said second bath being adapted to form a second plating layer on the first plating layer;

a first washing station disposed between the first plating bath and the second plating bath in the process path;

a second washing station disposed after the second plating bath in the process path; and a drying station disposed after the second washing station in the process path.

2. The apparatus of claim 1, further comprising:

a first pump in fluid contact with the first plating bath and a source of the first plating solution; and a second pump in fluid contact with the second plating bath and a source of the second plating solution.

3. The apparatus of claim 1, further comprising:

a preprocessing bath disposed before the first bath in the process path and containing an aqueous sulfuric acid solution; and a third washing station between the preprocessing bath and the first bath in the processing path.

4. An apparatus for plating a substrate comprising:

a plating bath;

a first plating solution supply for supplying a first plating solution to said plating bath;

a second plating solution supply for supplying a second plating solution different from the first plating solution to said plating bath; and a switch for switching the supply of said first plating solution from said first plating solution supply and said second plating solution from said second plating solution supply to said plating bath on and off.

5. The apparatus of claim 4, wherein the plating bath is connected to a wash water supply device.

6. The apparatus of claim 4, wherein the switch comprises a valve.

7. The apparatus of claim 6, wherein the switch comprises a timer for opening and closing the valve.

8. An apparatus for plating a metal within fine pits in a surface of a substrate, comprising:

a first plating bath for containing a first plating solution to form a first plating layer of the metal by electroplating with a first current density within the fine pits formed in the surface of the substrate, and a second plating bath for containing a second plating solution different from the first plating solution to form a second plating layer of the metal by electroplating with a second current density on the first plating layer, wherein said second current density is larger than said first current density.

9. The apparatus of claim 8, wherein the first plating solution is supplied via a pump and a shut-off valve disposed upstream of the pump, and the second plating solution is supplied via a pump and a shut-off valve disposed upstream of the pump.

10. The apparatus of claim 7, further comprising a washing station for washing the substrate with the first plating layer prior to form the second plating layer.

11. An apparatus for plating a plurality of fine pits covered with a barrier layer in a surface of a substrate, comprising:

a first plating bath for containing a first plating solution to form a first plating layer directly on the entire surface of the barrier layer within the fine pits, and a second plating bath for containing a second plating solution to form a second plating layer on the first plating layer.

12. The apparatus of claim 11, wherein the first plating solution is supplied via a pump and a shut-off valve, which is disposed upstream from the pump, from a first plating solution supplying section; and the second plating solution is supplied via a pump and a shut-off valve, which is disposed upstream from the pump, from a second plating solution supplying section.

* * * * *

UNITED STATES PATENT AND TRADEMARK OFFICE
CERTIFICATE OF CORRECTION

PATENT NO.    : 6,908,534 B2
DATED         : June 21, 2005
INVENTOR(S)   : Akihisa Hongo et al.

It is certified that error appears in the above-identified patent and that said Letters Patent is hereby corrected as shown below:

Column 10,
Line 24, change "7" to -- 8 --.

Signed and Sealed this

Twenty-third Day of August, 2005

JON W. DUDAS
*Director of the United States Patent and Trademark Office*